United States Patent [19]

Jonckheere

[11] 3,886,455

[45] May 27, 1975

[54] PHASE LOCK LOOP INCLUDING AN OSCILLATING SUB-LOOP

[75] Inventor: Valere G. Jonckheere, Edegem, Belgium

[73] Assignee: International Standard Electric Corporation, New York, N.Y.

[22] Filed: Dec. 18, 1973

[21] Appl. No.: 425,893

[52] U.S. Cl. ................ 325/148; 325/346; 329/122; 331/4; 331/25; 332/19

[51] Int. Cl. .......................... H03b 3/08; H03b 3/14

[58] Field of Search ............................ 329/122–125; 331/4, 18, 23, 25; 325/346, 419, 148; 332/19

[56] References Cited

UNITED STATES PATENTS

| | | | |
|---|---|---|---|
| 3,393,380 | 7/1968 | Webb | 329/122 X |
| 3,514,718 | 5/1970 | Newton | 331/23 X |
| 3,621,405 | 11/1971 | Carlsen | 331/25 X |
| 3,775,695 | 11/1973 | Hill | 331/25 |
| 3,793,594 | 2/1974 | Griswold | 331/4 |

*Primary Examiner*—Alfred L. Brody
*Attorney, Agent, or Firm*—John T. O'Halloran; Menotti J. Lombard, Jr.; Alfred C. Hill

[57] ABSTRACT

There is disclosed a phase lock loop including an oscillating sub-loop which provides a sweep signal for the voltage controlled oscillator of the main loop so as to bring the main loop into its lock-in range. The sub-loop is coupled between the phase comparator and voltage controlled oscillator of the main loop in such a way that whether the sub-loop oscillates or does not oscillate is directly controlled by the out-of-lock and in-lock conditions of the main loop, respectively.

9 Claims, 2 Drawing Figures

PHASE LOCK LOOP INCLUDING AN OSCILLATING SUB-LOOP

BACKGROUND OF THE INVENTION

The present invention relates to a phase lock loop including a two-input phase comparator, a controlled oscillator coupled between the output of said phase comparator and one of said inputs of said phase comparator, and a sweep signal generator to apply a sweep signal to said controlled oscillator, said sweep signal generator being turned-on and switched-off when said loop is out-of-lock and in-lock, respectively.

Such a phase lock loop is known from the book "Phaselock Techniques" by F. M. Gardner, published by J. Wiley & Sons, Inc. New York, 1966, pages 50–51 (Sweep methods).

SUMMARY OF THE INVENTION

An object of the present invention is to provide a phase lock loop of the above type wherein the turn-on and the switch-off of said sweep signal generator is controlled in a very simple way without requiring additional circuitry.

According to the present invention this object is achieved due to the fact that said sweep signal generator is constituted by a second oscillator which forms part of a sub-loop of said phase lock loop, said sub-loop being coupled between said phase comparator and said controlled oscillator in such a way that the oscillatory condition of said second oscillator is directly controlled by said in-lock and out-of-lock conditions of said phase lock loop.

In accordance with a preferred embodiment the phase lock loop of the present invention includes a stable main loop and a sub-loop which is able to oscillate at a predetermined frequency, and which at that frequency has an open-loop gain which is much smaller than that of the main loop. The main loop includes the cascade connection of a phase comparator, an adder circuit, a first stage of a differential filter amplifier the first and second stages of which each include a phase lead-lag feedback network, a voltage-controlled oscillator, a directional coupler and a negative feedback circuit including a multiplier coupled between the directional coupler and the phase comparator. The sub-loop includes the second stage of the above differential amplifier and an operational filter amplifier with a twin-T feedback network the output of this amplifier being coupled to an input of the adder circuit.

BRIEF DESCRIPTION OF THE DRAWING

The above mentioned and other objects and features of the invention will become more apparent and the invention itself will be best understood by referring to the following description of embodiments taken in conjunction with the accompanying drawing in which.

DESCRIPTION OF THE PREFERRED EMBODIMENT

Figures 1, 2:
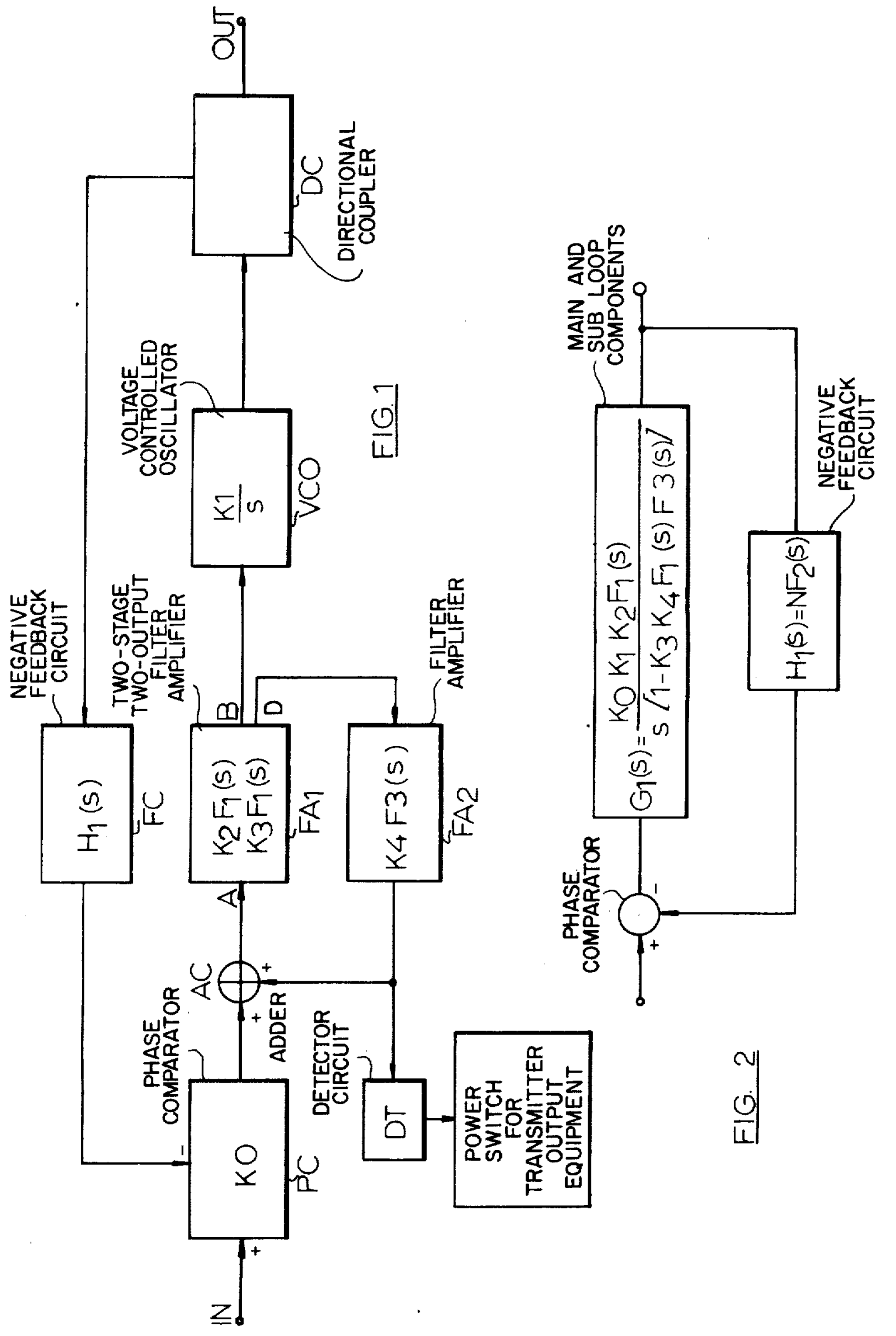
FIG. 1 is a schematic diagram of a phase lock loop according to the present invention.
FIG. 2 shows the phase lock loop of FIG. 1 in canonical form.

Referring to FIG. 1, the phase lock loop shown therein includes a main loop and a sub-loop and is built up by means of circuits which are well known in the art and which are therefore not shown in detail. The main loop includes the cascade connection of a two-input phase comparator or detector PC, a two-input adder circuit AC, stage AB of a two-output filter amplifier $FA_1$, a voltage-controlled oscillator VCO, a two-output directional coupler DC and a negative feedback circuit FC coupling an output of the directional coupler DC to an input of the phase comparator PC. The sub-loop is a positive feedback circuit and includes the cascade connection of stage AD of the filter amplifier $FA_1$ and filter amplifier $FA_2$ the output of which is connected to an input of the adder circuit AC. The output of the filter amplifier $FA_2$ is connected to the detector circuit DT to detect the oscillatory and non-oscillatory conditions of filter amplifier $FA_2$. The input IN of the phase comparator PC forms the input of the phase lock loop, while the output OUT of the directional coupler DC forms the output of this loop. This output is coupled to output equipment including a power amplifier, a multiplier and an antenna system (all not shown).

The phase lock loop forms part of a radio frequency (RF) transmitter and is used to amplify a frequency modulated RF signal applied to its input IN. This RF input signal is compared in the phase comparator PC with a second RF signal derived from the voltage-controlled oscillator VCO via the feedback circuit FC. The output of the phase comparator PC contains an error signal which modulates oscillator VCO. To lock the oscillator VCO to the frequency of the input signal the oscillator is tuned by means of a sweep signal provided by the above sub-loop so that the difference frequency between the above RF signals is within the capture range of the loop. The oscillator VCO will then be pulled into phase lock.

The phase comparator PC has a gain factor $K_0$, while the voltage-controlled oscillator VCO has a gain constant $K_1$ and a transfer function $K_1/s$ where $s$ is a complex variable defined by $s \equiv \sigma + jw$, where $\sigma$ is a real number and $w$ is an angular velocity. The filter amplifier $FA_1$ is a differential amplifier with the above two stages AB and AD each including a phase lead-lag feedback circuit, the phase of the output D being at 180° from that of the output B. The filter amplifier stages AB and AD have the transfer functions $K_2F_1(s)$ and $K_3F'_1(s)$, respectively. The directional coupler DC is used to couple part of the output signal of oscillator VCO to the negative feedback circuit FC. The latter circuit is constituted by a multiplier circuit and has a transfer function $H_1(s) = NF_2(s)$, N being the multiplication factor of the multiplier which in fact multiplies the gain constant of oscillator VCO. The filter amplifier $FA_2$ is constituted by an operational amplifier with a twin-T filter feedback circuit and with a transfer function $K_4F_3(s)$.

Since the above sub-loop includes stage AD of the filter amplifier $FA_1$ with transfer function $K_3F'_1(s)$ and the filter amplifier $FA_2$ with transfer function $K_4F_3(s)$ the closed loop transfer function of this sub-loop is equal to $$1/1 - K_3K_4F'_1(s)F_3(s),$$

where $K_3$ and $K_4$ are gain constants, $K_3F'_1(s)$ is the transfer function of stage AD of filter amplifier $FA_1$ and $K_4F_3(s)$ is the transfer function of filter amplifier $FA_2$.

The open loop transfer function of the phase lock loop is therefore equal to:

$$G(s)=K_0K_1K_2N\ F_1(s)\ F_2(s)/s\ [1-K_3K_4\ F'_1(s)\ F_3(s)],$$

where $K_0$ is the gain factor of phase comparator PC, $K_1$ and $K_2$ are gain constants, $K_1/s$ is the transfer function of oscillator VCO, $K_2F_1(s)$ is the transfer function of stage AB of filter amplifier $FA_1$, N is the multiplying factor of feedback circuit FC and $NF_2(s)$ is the transfer function of feedback circuit FC.

When no signal is being applied to the input IN of the phase lock loop, and in general when the phase lock loop is out-of-lock, the above sub-loop obviously forms a circuit which is independent from the main loop since the latter is then not operative. This sub-loop, i.e., its parameters $K_3$, $K_4$, $F'_1(s)$ and $F_3(s)$, has been so calculated that it then oscillates and generates an AC (alternating current) output signal having a frequency $w_1$. This output signal is applied through the stage AB of the filter amplifier $FA_1$ to oscillator VCO where it forms a sweep signal for tuning oscillator VCO. The sub-loop may thus be considered as a sweep signal generator.

In a practical embodiment of the phase lock loop the gain factor $K_3K_4$ is disposed between a minimum of 2 (6 decibel) and a maximum of 2.8 (9 decibel). This maximum value is equal to $K_2$. The sweep voltage applied to oscillator VCO is an AC signal of V = 4 Volts with a frequency $w_1 = 312$ Hz. Oscillator VCO provides at the input of the phase comparator PC a sweep signal having a frequency equal to $V.K_1.N$ or 192 Hz peak-to-peak when $K_1 = 12$ MHz/Volt and N = 4.

The above mentioned main loop has been so calculated that it is unconditionally stable and has an open-loop gain at the above oscillating frequency which is much larger than that of the sub-loop. Also the stable condition of the main loop is such that it is not affected by the sub-loop. Therefore, when an input signal is applied to the input IN of the phase lock loop at the moment the sub-loop is oscillating the open-loop gain of the main loop will substantially not be unaffected by that of the sub-loop so that the open-loop gain of the whole phase lock loop will not be very different from that of the main loop. For such conditions, the oscillatory condition of the sub-loop is stopped when the phase lock loop locks in. The oscillatory condition of the oscillating sub-loop is hence directly controlled by the lock-in and out-of-lock conditions of the phase lock loop without additional equipment being required.

In a practical embodiment of the phase lock loop the so called DC (direct current) loop gain, i.e. the gain considered at $w = 1$, is equal to $G_0 = K_0K_1K_2N = 2\pi.20.10^6$ so that since $F_1(s)$ and $F_2(s)$ are both equal to 1 in a large frequency domain including $W_1 = 312$ Hz the open loop transfer function of the above main loop at this frequency may be written: $G'(w_1)=GO/w_1=2\pi.20.10^6/2\pi.312=6.4\ 10^4$ Hz or 96 decibel. The above open loop transfer function of the whole loop at the frequency $w_1$ is equal to: $G(w_1)=6.4.10^4/1-K_3K_4=-3.55\ 10^4$ Hz or $-91$ decibel since $F'_1(s)$ and $F_3(s)$ are also both equal to 1 at $w_1 = 312$ Hz and $K_3K_4 = 2.8$ (maximum). At the frequency $w_1 = 312$ Hz the magnitude of the open loop gain of the main loop is hence only slightly affected by the gain of the sub-loop.

As follows from the above the gain of the main loop and of the whole loop decreases with a slope of 20 decibel per decade due to the factor 1/s. The oscillatory frequency of the sub-loop has been chosen relatively small since at that frequency the open loop gain of the main loop is considerably larger than that of the sub-loop.

As already mentioned above the phase lock loop forms part of a transmitter and is coupled to output equipment. In order to prevent this transmitter from transmitting as long as the phase lock loop is not in-lock the detector DT has been provided to detect the oscillatory and non-oscillatory conditions of the loop and to accordingly switch-off and turn-on the power from the output equipment.

While the principles of the invention have been described above in connection with specific apparatus, it is to be clearly understood that this description is made only by way of example and not as a limitation on the scope of the invention.

I claim:

1. A phase lock loop comprising:

a two input phase comparator;

a loop input coupled to one input of said comparator;

a two input adder having one input thereof coupled to the output of said comparator;

a voltage controlled oscillator coupled to the output of said adder;

a feedback circuit coupled between the output of said oscillator and the other input of said comparator; and a sweep signal generator including a sub-loop of said phase lock loop coupled between the output of said adder and the other input of said adder, said sub-loop having an oscillatory condition directly controlled by the in-lock and the out-of-lock conditions of said phase lock loop.

2. A phase lock loop according to claim 1, wherein said sub-loop includes a filter amplifier.

3. A phase lock loop according to claim 1, further including a first filter amplifier coupled between the output of said adder and the input of said oscillator.

4. A phase lock loop according to claim 3, wherein said sub-loop includes a second filter amplifier having its output coupled to said other input of said adder; and said first filter amplifier includes a first stage coupled between the output of said adder and the input of said oscillator, and a second stage coupled between the output of said adder and the input of said second filter amplifier.

5. A phase lock loop according to claim 4, wherein the output signal of said second stage has a 180° phase relation with respect to the output signal of said first stage.

6. A phase lock loop according to claim 3, wherein said first filter amplifier includes a first stage coupled between the output of said adder and the input of said oscillator, and a second stage coupled in said sub-loop.

7. A phase lock loop according to claim 6, wherein the output signal of said second stage has a 180° phase relation with respect to the output signal of said first stage.

8. A phase lock loop according to claim 1, further including a detection means coupled to said sub-loop to detect the oscillatory and non-oscillatory conditions of said sub-loop.

9. A phase lock loop according to claim 8, wherein said phase lock loop forms part of a transmitter including a power switch-off and turn-on means, and said detection means controls said power switch-off and turn-on means.

* * * * *